United States Patent [19]
Gelzinis

[11] Patent Number: 5,914,280
[45] Date of Patent: Jun. 22, 1999

[54] DEEP TRENCH ETCH ON BONDED SILICON WAFER

[75] Inventor: Peter Victor Gelzinis, Palm Bay, Fla.

[73] Assignee: Harris Corporation, Melbourne, Fla.

[21] Appl. No.: 08/771,944

[22] Filed: Dec. 23, 1996

[51] Int. Cl.⁶ .................................................. H01L 21/00
[52] U.S. Cl. ........................................... 438/734; 438/719
[58] Field of Search ..................... 438/218, 714, 438/719, 734, 735; 216/39, 56, 67, 79

[56] References Cited

U.S. PATENT DOCUMENTS

| | | |
|---|---|---|
| 4,534,826 | 8/1985 | Goth et al. . |
| 4,589,193 | 5/1986 | Goth et al. . |
| 4,726,879 | 2/1988 | Bondur et al. . |
| 4,889,588 | 12/1989 | Fior ........................................ 438/714 X |
| 4,943,344 | 7/1990 | Tachi et al. . |
| 5,043,786 | 8/1991 | Desilets et al. . |
| 5,227,658 | 7/1993 | Beyer et al. . |
| 5,306,671 | 4/1994 | Ogawa et al. . |
| 5,382,541 | 1/1995 | Bajor et al. . |
| 5,385,861 | 1/1995 | Bashir et al. . |
| 5,411,913 | 5/1995 | Bashir et al. . |
| 5,429,070 | 7/1995 | Campbell et al. . |
| 5,453,403 | 9/1995 | Meng et al. ............................. 438/734 |
| 5,458,734 | 10/1995 | Tsukamoto . |
| 5,470,781 | 11/1995 | Chidambarrao . |
| 5,484,738 | 1/1996 | Chu et al. . |
| 5,517,047 | 5/1996 | Linn et al. . |
| 5,521,399 | 5/1996 | Chu et al. . |
| 5,522,966 | 6/1996 | Komura et al. . |

*Primary Examiner*—William Powell
*Attorney, Agent, or Firm*—Jaeckle Fleischmann & Mugel, LLP

[57] ABSTRACT

A quick, deep, clean two step trench process for an SOI/bonded wafer substrate 100 is disclosed. A first isotropic plasma etch using SF6 is made through an opening 40 in the photoresist layer on device layer 16. A second anisotropic plasma etch using SF6 and Cl2 stops on the isolation/bond oxide layer 14. The bottom of the trench 60 is overetched to form cavities 50 on the isolation/bond oxide layer 14 without removing a substantial portion of that layer.

18 Claims, 2 Drawing Sheets

DEEP TRENCH ETCH ON BONDED SILICON WAFER

BACKGROUND

The present invention relates in general to etching trenches, and, in particular, to a method for etching trenches in silicon-on-insulator (SOI) or bonded wafer substrates.

Trenches are etched in SOI and bonded wafer substrates to provide isolation between adjacent devices, contact to a buried layer, or both. See, for example, U.S. Pat. Nos. 5,517,047, 5,382,541, and Ser. No. 336,768 filed Nov. 9, 1994, U.S. Pat. No. 5,643,021 and assigned to the assignee of this application and herein incorporated by reference. While there are many ways of etching trenches, SOI and bonded wafer devices with relatively thick device layers (e.g. 18 microns or greater) present unique problems for device manufacturers. A deep trench exposes the lower corner of the silicon in the device island. When the sidewalls of trenches are oxidized, oxide grown on the bottom corners of the trench generate lattice defects. Oxide growth and corresponding defects can also occur at the top corners of the trench.

One approach to solving this problem as shown in FIGS. 1A–1D, removes or rounds the corners. There a bonded wafer structure 10 includes a handle substrate 12, typically of silicon, isolation/bond oxide layer 14, and a device layer 16 of monocrystalline silicon. The device layer 16 is between 17–22 microns thick. A masking oxide layer 18 is grown on top of device layer 16. Photoresist layer 20 is deposited on the masking oxide layer 18 and an opening 22 is formed in the photoresist layer 20. The masking oxide layer 18 is approximately 2 microns thick and the isolation/bonding oxide layer 14 is approximately two microns thick. As a first step the oxide layer 18 is subjected to a wet isotropic etch, typically performed using a solution of hydrofllouric acid, typically a 10:1 solution. This etch creates the isotropic opening 24 in the masking oxide layer 18. Next, the photoresist layer 20 is stripped and a trench 30 is formed using a plasma etch process. A typical plasma etch process uses high power (750 watts) with BC13 as the only active etching agent to remove any residual oxide from the surface of device layer 16. Cl2 is then added to the plasma reaction in order to etch the trench 30. The mouth of the trench 30, however, has a bevel 26. Some of the isolation/bond oxide layer 14 is also removed. In a final step, the masking oxide layer 18 is removed. During that operation, still more of the isolation/bond oxide layer 14 is removed to leave a groove 28 in the isolation/bond oxide layer 14 at the bottom of the trench. It is often difficult to maintain selectivity between silicon and the thin masking oxide and the etch may remove the masking oxide and thereby expose and damage the surface of the device layer.

Another prior art method is shown in U.S. Pat. No. 5,084,408 issued to Baba et al. In that method a trench is initially anisotropically etched down to the isolation oxide. The isolation oxide is intentionally overetched and a portion of the top oxide mask is also etched in order to expose the corners of the device layer. Next the exposed corners are isotropically etched in order to minimize stress due to known problems inherent in oxidizing square corners at the top and at the bottom of the trench. The method of Baba et al. improves upon the method shown in FIGS. 1A–1D by rounding the top and bottom corners of the trench.

Still others have proposed using different chemistries to etch deep trenches. See, for example, U.S. Pat. No. 4,943,344 which discloses using one or more of $SF_6$, $Cl_2$, $F_2$, of $Br_2$ in combination with only a photoresist mask to etch a trench in a substrate. All etches are carried out at low temperatures. $SF_6$ alone etches at temperatures of minus 100° C. or less and $Cl_2$ etches at temperatures of minus 40° C. or less. It is both expensive and time consuming to perform the etches at controlled, low temperatures. U.S. Pat. No. 5,470,781 also discloses using $SF_6$ and $Cl_2$ to etch a trench in an SOI substrate. However, the latter patent requires further processing steps to remove both the top oxide mask and to round the top corners of the trench.

Accordingly, there has been a long felt need for more efficient method of etching deep trenches. There likewise has been a need for a method of etching deep trenches in SOI and bonded wafer substrates.

SUMMARY

The invention provides a method for forming an isolation trench around an island of device silicon in a layer of device silicon of a silicon-on-insulator substrate. The method includes the steps of covering the device layer with a non-oxide masking layer such as photoresist. A trench pattern is formed in the photoresist layer. The upper portion (the mouth of the trench) is isotropically etched using a plasma etching technique with $SF_6$ as the active, isotropic etching agent. The lower portion of the trench is anisotropically etched using plasma etching where the active elements are $SF_6$ and $Cl_2$. The anisotropic etching is continued at the lower portion of the trench to form a base cavity at the bottom of the trench by removing the corners of silicon from the trench wall adjacent the isolation bond oxide layer. By using $SF_6$ and $Cl_2$ in a dry plasma etch, the device silicon layer is etched without removing significant portions of the insulating/bond layer of the SOI/bonded wafer substrate.

This method has several practical advantages. It eliminates the need for oxide masking which eliminates the steps of depositing an oxide mask, patterning the oxide mask, and removing the oxide mask. The invention does not remove the buried oxide layer. The invention provides a wide mouth at the top of the trench. The mouth of the trench extends about 10–30 percent of the thickness of the device silicon layer and the major portion of the trench is approximately 90–70 percent of the thickness of the device silicon layer. The wide mouth facilitates subsequent processes including oxidation of the sidewalls of the trenches and filling the trenches with materials such as polysilicon.

DETAILED DESCRIPTION

Figure 1A:
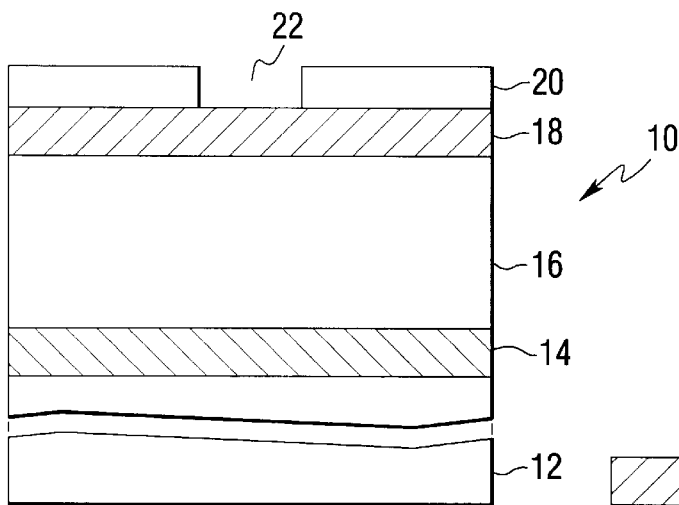
FIGS. 1A–1D show sequential steps in a prior art trench process.
Figure 1C:
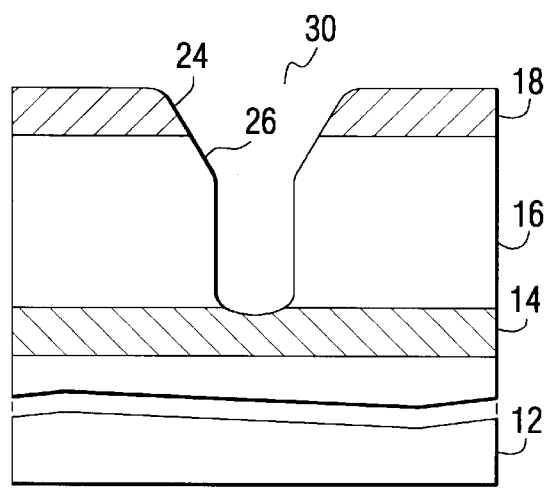
Figure 1B:
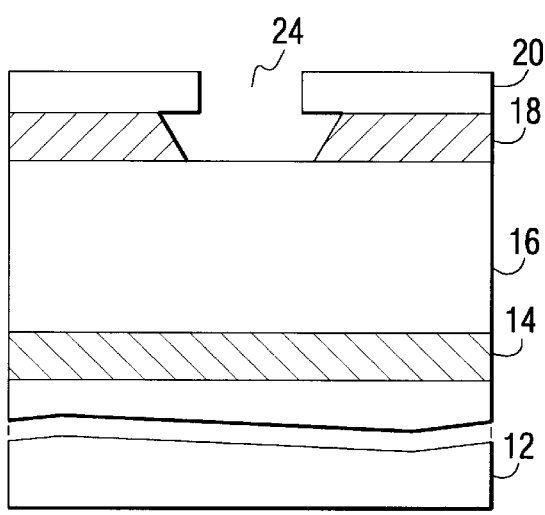
Figure 1D:
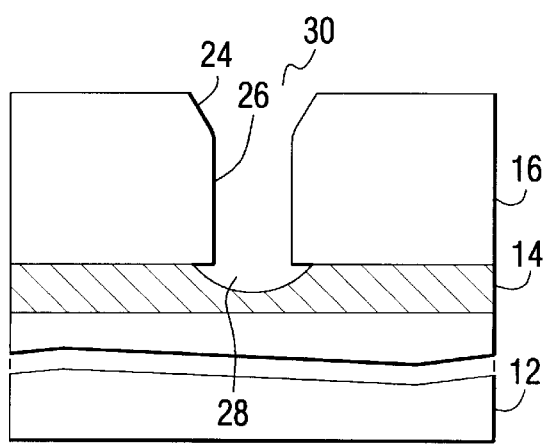

A sequence of steps for carrying out the invention is shown in FIGS. 2A–2D where like reference numerals refer to corresponding elements in FIGS. 1A–1D. The invention solves a number of problems with prior art methods and may be used in connection with standard dry plasma etching equipment such as the Lamb/Quad 480 etch system. The invention provides rapid, clean, and deep etching of trenches in a silicon-on-insulator/bonded wafer 100. The invention has an etch rate that is equal to or greater than 1.2 to 1.3 microns per minute. The invention etches trenches as deep as 22 microns. The chemicals used with the invention include $SF_6$ and C2. These chemicals replace prior art chemicals that included conventional BCL3 and Cl2 etching chemistries which leave debris and thus create micromasking problems. Micromasking occurs when a debris particle interferes with the etch. Micromasking results in rough, rather than smooth, etched surfaces. Micromasking results in "black silicon" when the rough surfaces are observed through optical inspection equipment. It is believed that micromasking results from the use of boron in the etching chemistry. By eliminating boron from the etching chemistries and adding SF6, micromasking is virtually eliminated. The invention also eliminates top side oxide masks and relies solely on photoresist masks.

The SOI/bonded wafer substrate 100 has a device layer 16 that may be as thick as about 17–22 microns. In the device layer 16 one skilled in the art may form integrated circuits and semiconductor devices including diodes, transistors, resistors, and capacitors. Such devices may be formed using one or more fabrication technologies including bipolar fabrication, metal oxide semiconductor fabrication, and a combination of bipolar and metal oxide semiconductor fabrication techniques. Such devices are separated from each other in device layer 16 by isolation trenches. The trench 60 shown in FIG. 2D may be used to form an isolation trench as will be further described hereinafter.

Figure 2A:
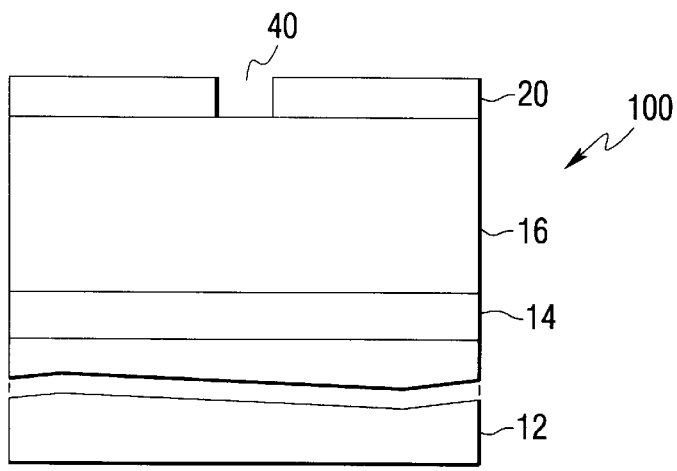
FIGS. 2A–2D show sequential steps in forming trenches using the process of the invention
Figure 2B:
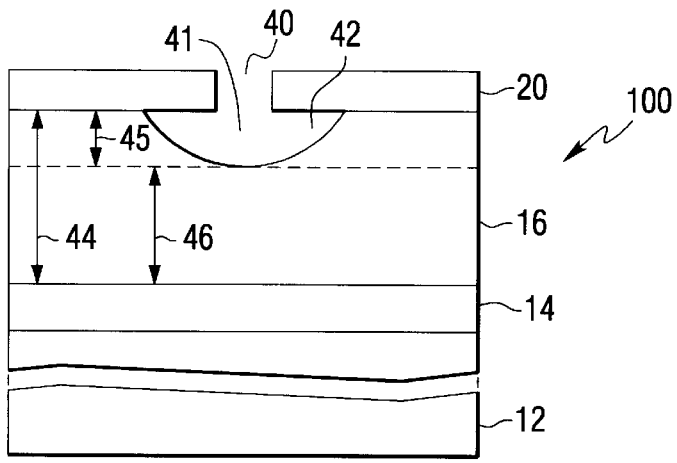

The upper surface of device layer 16 is wet etched and deglazed to remove any surface oxide. Next, the upper surface of device layer 16 is coated with a layer of photoresist. The layer of photoresist is approximately 26.5 KA of Shipley 818L photoresist. The photoresist layer 20 is imaged with a trench masking pattern, is developed and the undeveloped photoresist is removed to provide the trench pattern opening 40 in the photoresist layer 20. While only one trench opening 40 is shown in FIG. 2A, those skilled in the art will appreciate that any number of trench openings may be made into the photoresist layer 20. After exposure and development, the photoresist layer 18 is hard baked in a suitable oven for about 30 minutes at about 110° C. in order to harden the remaining portions of the photoresist layer 20.

An initial plasma assisted isotropic etch using SF6 is performed on the substrate 100. The initial isotropic etch forms a surface cavity 42 in the upper surface of the device layer 16. The device layer 16 has a total thickness 44. The thickness 46 is the remaining portion of the device layer 16 beneath the surface cavity 42. In the first step shown in FIG. 2B, the electrode gap space of the etcher is 1.25 inches and the electrode temperature is about 35° C., plus or minus 5° C. The only gas used to etch the cavity 42 is SF6. It flows at a rate of 60 cubic centimeters per minute at a pressure of 105 mT. The RF power is approximately 125 watts. The etch is a timed etch. The etch rate of SF6 in silicon is well known. Hence, controlling the time of the etch controls the depth 45 of the surface cavity 42. In the preferred embodiment of the invention, the etch time is about 3.5 minutes. A 3.5 minute etch removes enough silicon at the mouth of the trench to provide the desired slope at the mouth. The time and thus the amount and the slope of the mouth may be varied depending upon the desired shape of the mouth or the available real estate, or both. That results in a surface cavity 42 that has an opening at the interface of the photoresist layer 20 and the device layer 16 of approximately 8.5–9.5 microns. The depth 45 is approximately 20 percent of the total thickness 44 of the device layer 16. The invention contemplates a first step where the depth 45 is in the range of about 10–30 percent of the total depth of the device layer 16. An advantage of the invention is using a first isotropic etch step to widen the mouth 41 of the trench at the top of the trench prior to anisotropically etching the lower portion of the trench.

Figure 2C:
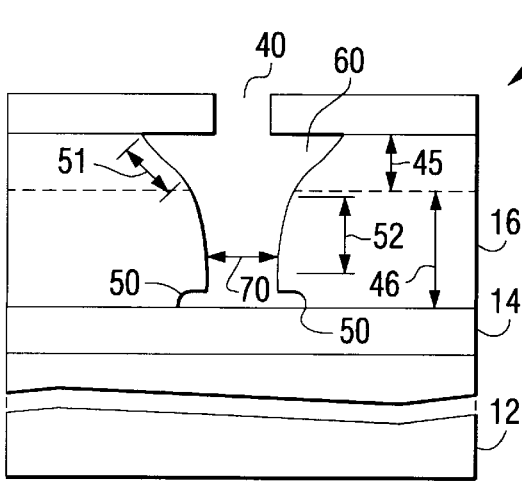

The lower portion of the trench is anisotropically etched as shown in FIG. 2C. There, a second, anisotropic etch is carried out using a combination of SF6 and Cl2. The SF6 maintains it's flow rate at 60 cubic centimeters per minute and Cl2 is added at a flow rate of 5 cubic centimeters per minute. The pressure and the power remain the same. The anisotropic etch proceeds for about 13.5 minutes, plus or minus 1 minute. The anisotropic etch removes material from the thickness 46 beneath the surface cavity 42 and stops on the isolation/bond oxide layer 14. The anisotropic portion of the etch in the thickness 46 has a sidewall spacing 70 that is approximately one micron wider on each wall than the opening 40 in the photoresist layer 20. However, the silicon at the bottom of the trench on the surface of the isolation/bond oxide layer 14 is overetched to establish a base cavity 50 that extends beyond the distance 70 of the trench sidewalls. The base cavity 50 is an annular cavity that surrounds the base of the trench on the isolation/bond oxide layer 14. The base cavity 50 removes the sharp corners of the bottom of the trench at the interface of device layer 16 and the isolation/bond oxide layer 14. Removing the bottom corners of the trench reduces lattice slip in device layer 16. The remaining photoresist layer 20 is then stripped by methods well known in the art.

In the second step shown in FIG. 2C, it is believed that chlorine ions act on the photoresist layer 20 to release carbon. It is further believed that the carbon coats the adjacent sidewalls of the trench in order to prevent excessive etching and thereby results in the anisotropic etch of the trench in the lower region 46. While chlorine in combination with SF6 results in a preferred, clean etch of the trench 60, those skilled in the art will appreciate that any other suitable chemistry that releases carbon from photoresist layer 20 for coating the sidewalls of the trench in the lower region 46 may be substituted.

Figure 2D:
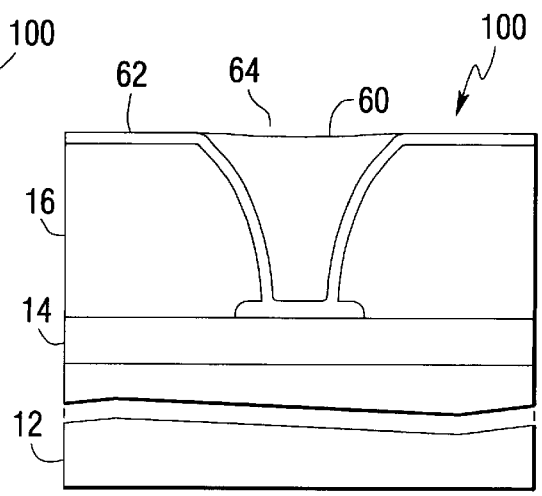

As a result of the second step, a trench 60 is formed as shown in FIG. 2D. The trench 60 may then be coated with a layer of thermal oxide 62 and filled with a suitable filler material 64 such as polysilicon or deposited oxide. The filler material is planarized as shown in FIG. 2D. The polysilicon 64 is generally provided using low pressure chemical vapor deposition rather than atmospheric pressure chemical vapor deposition in order to minimize voids in the trench 60.

One of the advantages of the invention is that the isolation/bond oxide layer 14 is not undercut by any etching step. This advantage is in sharp contrast to the prior art shown in U.S. Pat. No. 5,084,408. It is also an advantage over the inherent oxide removal of the buried oxide layer shown in U.S. Pat. No. 5,470,781. Removal of the buried oxide layer is inherent since some of it will necessarily be removed when the top side oxide mask is removed.

The opening 40 is approximately 2–3 microns wide. As such, the width of the trench in lower region 46 is approximately 4–6 microns wide. Those skilled in the art will appreciate that the trench 60 has at least two slopes for its sidewalls. In the upper region 45, the trench has a slope 51 and in the lower region 46, the trench is generally straight walled or has a slight slope 52. The slope 51 in the upper region 45 is greater than the slope 52 in the lower region 46. In general, the width of the trench in the upper region 45 is approximately twice the width of the trench in the lower region 46. These proportions result in a trench 60 that is favorable for refilling without voids. The relatively large opening at the mouth or the top of the trench minimizes the possibilities of voids.

Having thus described the invention including its preferred embodiment, those skilled in the art will appreciate that further combinations, changes, additions, and deletions may be made to the above-described method without departing from the spirit and the scope of the invention as set forth in the following claims:

What I claim:

1. A method for forming an isolation trench around an island of silicon in a silicon device layer disposed on an insulator layer in a silicon-on-insulator substrate comprising the steps of:

covering the device layer with non-oxide masking layer;

forming a trench pattern in the non-oxide masking layer;

isotropically etching an upper portion of the trench; and after said isotropic etch, anisotropically etching the lower portion of the trench to the level of the insulator layer.

2. The method of claim 1 wherein the step of isotropically etching the upper portion of the trench comprises plasma etching with SF6.

3. The method of claim 1 wherein the step of anisotropically etching the lower portion of the trench comprises plasma etching with SF6 and Cl2.

4. The method of claim 1 wherein the non-oxide masking layer is photoresist.

5. The method of claim 4 wherein the step of covering the device layer with photoresist comprises depositing a layer of photoresist on the device layer.

6. The method of claim 1 comprising a further step of overetching silicon at the bottom of the trench.

7. The method of claim 1 wherein the step of anisotropically etching the lower portion of the trench exposes a portion of an insulator layer at the bottom of the trench and comprising a further step of removing the non-oxide masking layer without removing a significant amount of the insulator layer at the bottom of the trench.

8. The method of claim 1 wherein about 10–30 percent of the trench is isotropically etched and about 90–70 percent of the trench is anisotropically etched.

9. The method of claim 1 wherein the maximum width of the upper portion of the trench is about twice the width of the anisotropically etched lower portion of the trench.

10. A method for forming an isolation trench around an island of silicon in a silicon device layer on an insulator layer in a silicon-on-insulator substrate comprising the steps of:

covering the device layer with a layer of photoresist;

forming a trench pattern in the layer of photoresist;

etching a trench mouth into the device layer, said trench mouth having a tapered sidewall with a first slope with respect to an axis perpendicular to the device layer; and after etching the trench mouth, etching a trench body to the level of the insulator layer, said trench body having a second slope with respect to said axis, wherein the first slope is greater than the second slope.

11. The method of claim 10 wherein the step of etching the trench mouth comprises plasma etching with SF6.

12. The method of claim 10 wherein the step of etching the trench body comprises plasma etching with SF6 and CL2.

13. The method of claim 10 wherein the step of covering the device layer with photoresist comprises depositing a layer of photoresist on the device layer.

14. The method of claim 10 comprising a further step of overetching silicon at the bottom of the trench.

15. The method of claim 10 wherein the step of anisotropically etching the lower portion of the trench exposes a portion of an insulator layer at the bottom of the trench and comprising a further step of removing the non-oxide masking layer without removing a significant amount of the insulator layer at the bottom of the trench.

16. A method for forming an isolation trench around an island of silicon in a silicon device layer on a insulator layer in a silicon-on-insulator substrate comprising the steps of:

depositing a layer of photoresist on the device layer;

patterning the photoresist layer to form a trench pattern therein and exposing a portion of the device layer to define a mouth of a trench;

etching a trench mouth into the device layer, said trench mouth having a tapered sidewall with a first slope with respect to an axis perpendicular to the device layer; and after etching the trench mouth, etching a trench body to the level of the insulator, said trench body having a second slope with respect to said axis, wherein the first slope is greater than the second slope.

17. The method of claim 16 wherein the etching steps comprise plasma etching with SF6.

18. The method of claim 16 comprising a further step of overetching silicon at the bottom of the trench.

* * * * *

UNITED STATES PATENT AND TRADEMARK OFFICE
CERTIFICATE OF CORRECTION

Page 1 of 1

PATENT NO.     : 5,914,280
DATED          : June 22, 1999
INVENTOR(S)    : Peter Victor Gelzinis It is certified that error appears in the above-identified patent and that said Letters Patent is hereby corrected as shown below:

<u>Column 4,</u>
Line 58, delete "slight", and substitute therefor -- large --.
Line 59, delete "greater", and substitute therefor, -- less --.

<u>Column 6, claim 10,</u>
Line 8, delete "greater", and substitute therefor, -- less --.

<u>Column 6, claim 16,</u>
Line 39, delete "greater", and substitute therefor, -- less --.

Signed and Sealed this

Nineteenth Day of March, 2002

Attest:

JAMES E. ROGAN
*Director of the United States Patent and Trademark Office*

*Attesting Officer*